(12) United States Patent
Pauly et al.

(10) Patent No.: US 7,257,509 B2
(45) Date of Patent: Aug. 14, 2007

(54) MEASURING DEVICE WITH FUNCTIONAL UNITS CONTROLLABLE VIA A BLOCK DIAGRAM

(75) Inventors: Andreas Pauly, Munich (DE); Thomas Braunstorfinger, Munich (DE); Wolfgang Kernchen, Sauerlach (DE); René Desquiotz, Gars (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 331 days.

(21) Appl. No.: 10/477,941

(22) PCT Filed: Apr. 30, 2002

(86) PCT No.: PCT/EP02/04762

§ 371 (c)(1),
(2), (4) Date: Jun. 7, 2004

(87) PCT Pub. No.: WO02/095426

PCT Pub. Date: Nov. 28, 2002

(65) Prior Publication Data

US 2004/0207637 A1 Oct. 21, 2004

(30) Foreign Application Priority Data

May 18, 2001 (DE) .............................. 101 24 371

(51) Int. Cl.
*G06F 19/00* (2006.01)
(52) U.S. Cl. ..................... 702/127; 340/500; 340/635; 340/653; 345/418; 715/764; 715/771
(58) Field of Classification Search ................ 340/500, 340/635, 653, 679, 680, 3.1; 345/418; 700/90; 702/127, 188; 715/762, 763, 764, 765, 771, 715/809, 810
See application file for complete search history.

(56) References Cited

U.S. PATENT DOCUMENTS 4,057,847 A * 11/1977 Lowell et al. ............... 702/122
4,162,531 A *  7/1979 Rode et al. .................. 702/90

(Continued)

FOREIGN PATENT DOCUMENTS

DE   198 46 855 A1   5/1999

(Continued)

OTHER PUBLICATIONS

Jamal, Rahman, Erhart, Wolfgang: LabVIEW. Programmiersprache de vierten Generation. In: Feinwerktechnik & Messtechnik 103, 1995, pp. 83-86, Germany.

*Primary Examiner*—Edward Cosimano
(74) *Attorney, Agent, or Firm*—Ditthavong Mori & Steiner, P.C.

(57) ABSTRACT

A measuring device, in particular a signal generator, comprises several functional units which may be connected to each other in various combinations, a control device which determines the connection and functions of the functional unites, and optical display device. The functional units are symbolized by function blocks which may be represented on the display device and graphically connected by connection elements. The control device controls the display device so that the functional blocks are graphically connected to each other correspondingly to the actual connection of the functional units by the connection elements.

20 Claims, 8 Drawing Sheets

U.S. PATENT DOCUMENTS

| | | | |
|---|---|---|---|
| 4,396,977 A * | 8/1983 | Slater et al. | 700/83 |
| 4,507,740 A * | 3/1985 | Star et al. | 702/57 |
| 4,760,330 A * | 7/1988 | Lias, Jr. | 714/32 |
| 4,812,996 A * | 3/1989 | Stubbs | 702/123 |
| 4,833,592 A * | 5/1989 | Yamanaka | 700/9 |
| 4,868,785 A * | 9/1989 | Jordan et al. | 345/440 |
| 4,974,181 A * | 11/1990 | Sinderson et al. | 702/182 |
| 5,027,279 A * | 6/1991 | Gottlieb et al. | 700/220 |
| 5,155,836 A | 10/1992 | Jordan et al. | |
| 5,309,556 A * | 5/1994 | Sismilich | 715/771 |
| 5,630,164 A | 5/1997 | Williams et al. | |
| 5,654,739 A * | 8/1997 | Sakai et al. | 345/440.1 |
| 5,859,885 A * | 1/1999 | Rusnica et al. | 376/259 |
| 5,953,009 A | 9/1999 | Alexander | |
| 6,008,808 A * | 12/1999 | Almeida et al. | 715/767 |
| 6,054,984 A * | 4/2000 | Alexander | 715/771 |
| 6,098,028 A * | 8/2000 | Zwan et al. | 702/120 |
| 6,259,428 B1 * | 7/2001 | Ramchandani et al. | 345/589 |
| 6,326,986 B1 * | 12/2001 | Alexander | 715/764 |
| 6,418,391 B1 * | 7/2002 | Umezu et al. | 702/123 |
| 7,200,529 B2 * | 4/2007 | Cifra et al. | 702/189 |
| 2005/0039170 A1 * | 2/2005 | Cifra et al. | 717/125 |
| 2007/0017515 A1 * | 1/2007 | Wallace et al. | 128/204.23 |

FOREIGN PATENT DOCUMENTS

| | | |
|---|---|---|
| DE | 199 42 315 A1 | 5/2001 |
| EP | 0529207 A1 * | 3/1993 |

* cited by examiner

MEASURING DEVICE WITH FUNCTIONAL UNITS CONTROLLABLE VIA A BLOCK DIAGRAM

FIELD OF THE INVENTION

The invention relates to a measuring device, especially, a signal generator, with several functional units.

BACKGROUND OF THE INVENTION

The configuration of the functional units, for example, with a base band unit, a fading unit, a noise unit, an I/Q-modulator and a high-frequency unit is variable within certain limits, and the function of functional units can be selected by the user from a predetermined range of functions.

The functions of measuring devices of this kind have conventionally been selected via operating keys (soft keys and hard keys). However, with this method of operation, the sequence in the signal flow according to which the individual functional units are connected to one another and influence the signal to be generated is not clearly evident. The currently active output sockets and the signals connected to them cannot be identified.

Regarding the technical background, reference must be made to U.S. Pat. No. 5,953,009. This document describes the allocation of trigger functions to the measurement channel of a digital oscilloscope by clicking on and moving icons symbolizing the trigger functions on the user interface. However, the signal flow of individual functional units and the function of these individual functional units cannot be identified from the user interface and cannot be selected on user interface.

SUMMARY OF THE INVENTION

The present invention is directed to providing a measuring device with variably configurable functional units, of which the functions are variable, wherein selection of the configuration of the functional units and selection of the function of the functional units is realized in a user-friendly manner.

The invention is based on the concept of providing a graphic display of functional blocks which symbolizes the functional units on a display device (display) also including their connections, wherein the functional blocks on the display device are graphically interconnected in a manner which corresponds with the current configuration of the functional units.

In this context, the function of the functional units can advantageously be selected by guiding a cursor by means of a positioning element (for example, a rotary knob or a mouse) to the graphic position of the corresponding functional block and, at the position of the functional block, selecting the required function from a function-selection list (menu) and/or a graphic function-selection window (window).

Examples of functional units are a base band unit, a fading unit, a noise unit, an I/Q-modulator, a high-frequency unit. These units may also be present at least as doubles, wherein the functional units of the two channels can be combined with one another in a variable manner within certain limits.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

One exemplary embodiment of the invention is described below with reference to the drawings. The drawings are as follows.

DETAILED DESCRIPTION OF THE PREFERRED EMBODIMENT

Figure 1:
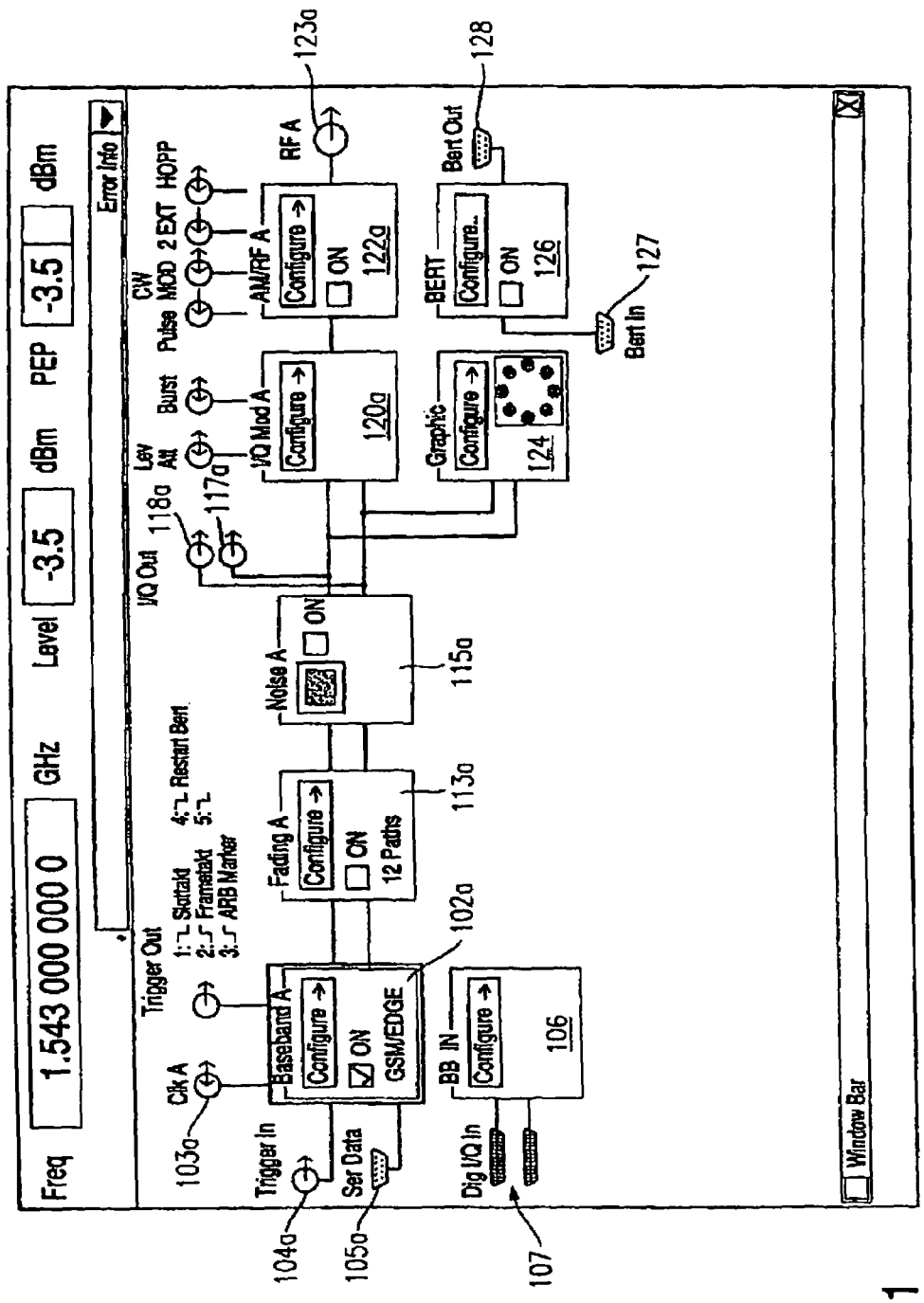
FIG. 1 shows a first example of the graphical display according to the invention of the functional blocks symbolizing the functional units.

Before describing the various examples of the graphic display of functional blocks in detail with reference to FIGS. 1 to 7, a block circuit diagram for a signal generator, which is designed as a measuring device according to the invention, will first be described with reference to FIG. 8.

The signal generator 1 comprises a first base band unit 2a and a second base band unit 2b. The base band units 2a and 2b generate base band signals at their I and Q outputs according to predefined standards which can be selected by the user, for example, according to the GSM standard, the GSM-EDGE standard or the Wideband-CDMA standard. The base band units 2a, 2b are supplied with clock signals at sockets 3a, 3b, trigger signals at sockets 4a and/or 4b and modulation data at sockets 5a and/or 5b. In the exemplary embodiment illustrated, a digital base band generator unit 6 is provided alongside these units, which generates the I and Q components of a further base band signal from digital I/Q-values supplied to socket 7. The output signal from the digital base band generator 6 can be multiplied in a multiplication unit 8, to which the constant frequency from an adjustable local oscillator 9 is supplied.

The optionally multiplied base band signal from the digital base band generating unit 6 can be supplied via a switching element 10a and/or a second switching element 10b, to the digital addition unit 11a or digital addition unit 11b.

The output signal from the base band units 2a and 2b and/or from the addition units 11a and 11b is supplied, via a switching element 12a and/or a switching element 12b, to a fading unit 13a and/or 13b, which applies fading (variable decrease) to the base and signal. The functions of the fading units 13a and 13b, such as the number, the time delay and the attenuation of the signal delay paths implemented in the fading unit can be specified by the user. The fading units 13a and 13b are connected via an addition unit 14a and/or 14b in each case to a noise unit 15a and/or 15b. The noise units 15a, 15b apply a noise signal, which can be specified by the user, to the base band signal, wherein, for example, the type and level of the noise signal generated by the noise unit 15a, 15b can be selected by the user.

Instead of providing a separate connection of the relevant fading units 13a and/or 13b to the allocated noise unit 15a and/or 15b, the output signals from the fading units 13a, 13b can be added by means of a switching element 16 which connects the addition units 14a and 14b, and supplied in each case, to one of the two noise units 15a and/or 15b. The I/Q-output signals at the output of the noise units 15a and/or 15b can be tapped at socket 17a and 18a or 17b and 18b.

The output signals from the noise units 17a and 17b can be supplied to I/Q-modulators 20a and/or 20b via addition units and switching units 19a and 19b. In this context, the output signals from the noise units 15a and 15b can be added via a switching element 21 and supplied to one of the two I/Q-modulators 20a and/or 20b. With reference to the function of the I/Q-modulators 20a and/or 20b, several user-specific selection options are also available. For example, the I/Q-modulator 20a, 20b can be operated in such a manner that it generates a burst-sequence, wherein the active bursts and/or the level of the active bursts can be selected by the user.

The I/Q-modulators 20a and 20b are each connected to a high-frequency unit 22a and/or 22b, and a high-frequency signal can be picked up at a socket 23a and/or 23b. For example, the output frequency or several output frequencies initiated according to the sudden frequency change procedure of the high frequency unit 22a and 22b can be selected by the user.

Additionally, a signal display 24 is provided, which, in the exemplary embodiment, can be connected via switching elements 25a and/or 25b to the output of the noise unit 15a or the noise unit 15b. Alternatively, it is also conceivable for the display device 24 to be connected directly to the outputs of the base band units 2a and 2b. For example, the signal display 24 allows a display of the configuration diagram, so that the user can monitor the method of operation of the connected signal paths.

Furthermore, a Bit Error Rate Tester (BERT) 26 is provided in such a manner that a signal from the device under test (DUT) can be supplied to the input socket 27 of the Bit Error Rate Tester allowing the bit error rate of the signal to be picked up at the output socket 28.

Further functional units and variant combinations of the functional units may also be provided. These have not been explained in greater detail for the sake of simplicity.

All of the functional units described above: 2a, 2b, 6, 8, 9, 10a, 10b, 11a, 11b, 12a, 12b, 13a, 13b, 14a, 14b, 15a, 15b, 16, 19a, 19b, 20a, 20b, 21, 22a, 22b, 24 and 26 are connected via a control bus to a control device 28 such as a CPU. The connection of the control bus to the functional units is indicated with the symbol (*). The control unit 28 controls the configuration and function of the individual functional units as required by the user. The current configuration of the functional units is displayed on the display device 29, which, together with the operating elements 30 may be disposed on the front of the signal generator 1. For this purpose, a graphic functional block is allocated to each functional unit, and the interconnection of the functional units is displayed on the display device 29 by corresponding connecting elements, which interconnect the functional blocks. The connections between the functional blocks and the functions of the functional blocks are selected either with a rotary knob 31 and/or corresponding operating buttons 32 or via a mobile positioning element 33 (mouse).

Several examples of the display of the functional blocks allocated to each of the functional units and the associated selection of functions for the relevant functional units will be explained below with reference to FIGS. 2 to 7.

FIG. 1 shows the display surface of the display device 29 in an initial functional example. It can be seen that the functional blocks presented on the display 29 correspond to the functional units described with reference FIG. 8. The reference numbers for the functional blocks are greater, in each case by the value 100, than the reference numbers for the functional units presented in FIG. 8. In FIG. 1, a first base band block 102a corresponding to the first base band unit 2a, a base band generating unit 106 corresponding to the base band generating unit 6, a first fading block 113a corresponding to the first fading unit 13a and a first noise block 115a corresponding to the first noise unit 15a, a first I/Q-modulator block 120a corresponding to the first I/Q-modulator 20a, a first high-frequency block 122a corresponding to the first high-frequency block 22a, a display field 124 corresponding to the signal display 24 and a bit error rate test block 126 corresponding to the bit error rate tester 26, are displayed as functional blocks. In this context, the signal inputs and outputs and the data inputs and outputs 103a, 104a, 105a, 107, 117a, 118a, 123a, 127 and 128 correspond to the socket 3a, 4a, 5a, 7, 17a, 18a, 23a, 27 and 28 as shown in FIG. 8.

By observing the display device 29, the user can recognize at a glance, on the basis of the functional blocks displayed, which functional units have been selected and connected for the current functions of the signal generator 1. Furthermore, the user can immediately recognize which inputs and outputs are provided with signals and in which manner. The internal signal flow and therefore also the signal conditioning are presented to the user in a very transparent manner. For example, the user can immediately see that the fading unit 13a is arranged in front of the noise unit 15a, whether the bursting of the signal is implemented in the base band or in the high-frequency band, and to which sockets external signals can be applied and how these will influence the signal flow. In particular, the user can immediately identify whether a socket is acting as an input or an output. Current configurations can be identified in the functional blocks, particularly important parameters being displayed directly in the functional blocks. Moreover, the user can clearly see at which position the signal display 24 is connected into the signal path.

Figure 2:
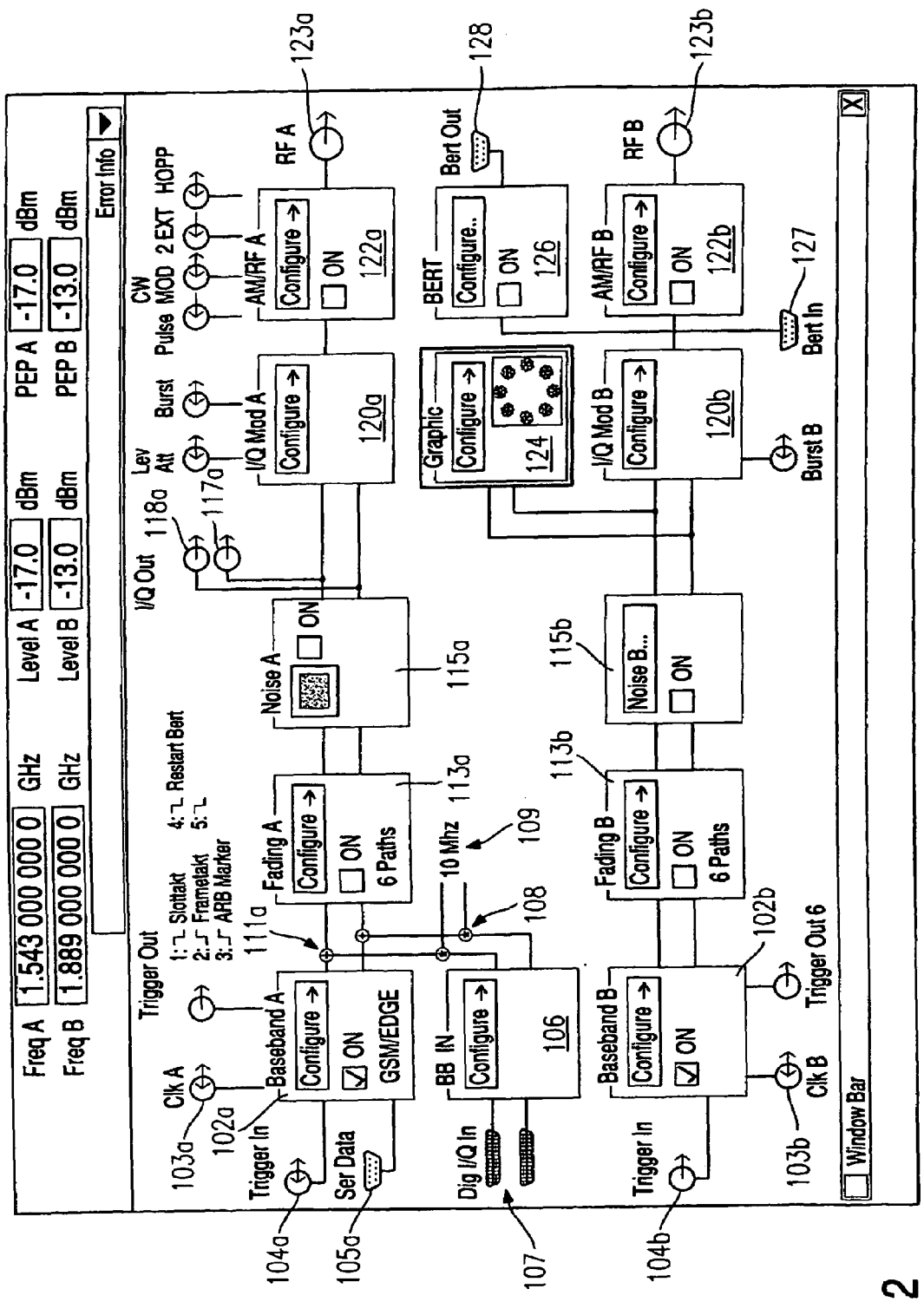
FIG. 2 shows a second example of the graphical display according to the invention of the functional blocks symbolizing the functional units.

FIG. 2 shows a second example of the graphic surface of the display device 29.

In this case, further functional blocks are provided alongside the functional blocks already described with reference to FIG. 1. Once again, the reference numbers for the functional blocks are greater by the value 100 than the reference numbers for the associated functional unit as shown in FIG. 8. By contrast with FIG. 1, a second base band block 102b symbolizing the second base band unit 2b, a second fading block 113b symbolizing the fading unit 13b, a second noise block 115b symbolizing the second noise unit 15b, a second I/Q-modulator block 120b symbolizing the second I/Q-modulator 20b and a second high-frequency block 122b symbolizing the second high-frequency unit 22b are additionally provided. Furthermore, the signal inputs and outputs and data inputs and outputs 104b, 103b and 123b correspond to the sockets 4b, 3b, 23b shown in FIG. 8. The local oscillator 9 is symbolizing by a frequency value at the position 109, while the multiplication unit 8 is symbolizing by the multiplication symbols 108, and the addition unit 11a is symbolizing by the addition symbols 111a.

By observing the display device 29, the user can immediately recognize the current configuration of the signal generator 1, namely that the two base band units 2a, 2b, fading units 13a, 13b, noise units 15a, 15b and I/Q-modulators 20a, 20b are not coupled to one another, but form separate signal paths, and that the digital base band generator 6 is added with a frequency offset of 10 MHz to the base band signal generated by the first base band unit 2a.

Furthermore, the user can observe in the display field 124 that the input signal to the second I/Q-modulator 20b is displayed as a configuration diagram.

Figure 3:
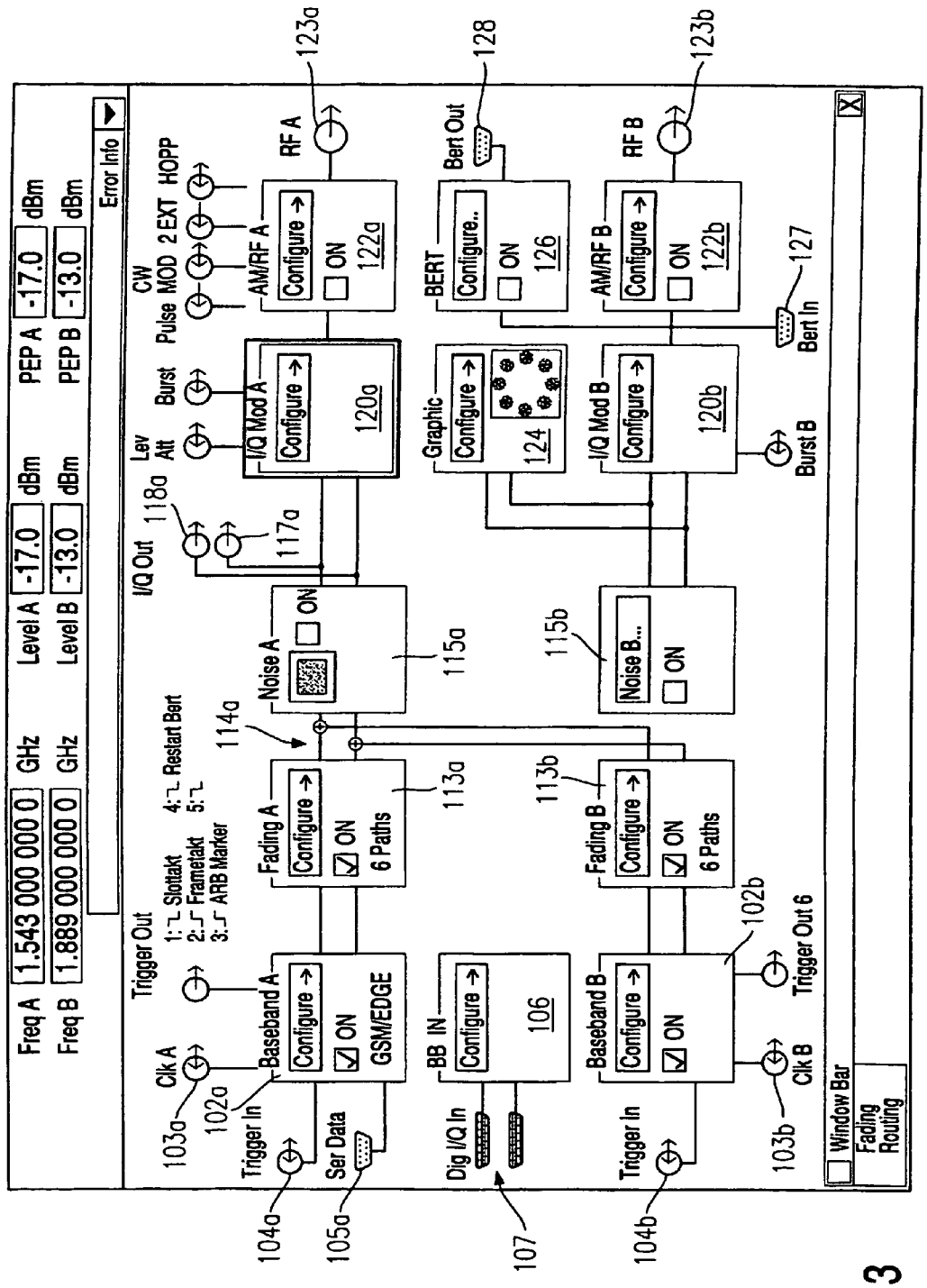
FIG. 3 shows a third example of the graphic display according to the invention of the functional blocks symbolizing the functional units.

FIG. 3 shows a third example of the graphic display of the functional blocks. Most of the functional blocks presented in FIG. 3 have already been described with reference to FIGS. 1 and 2. Addition symbols 114a symbolizing the addition unit 14a are additionally provided. The user can immediately recognize that the outputs from the two fading units 13a and 13b are connected to one another via the addition unit 14a and therefore that the added output signals from the fading units 13a and 13b are supplied to the noise unit 15a. By contrast, the input of the noise unit 15b is not used.

Figure 4:
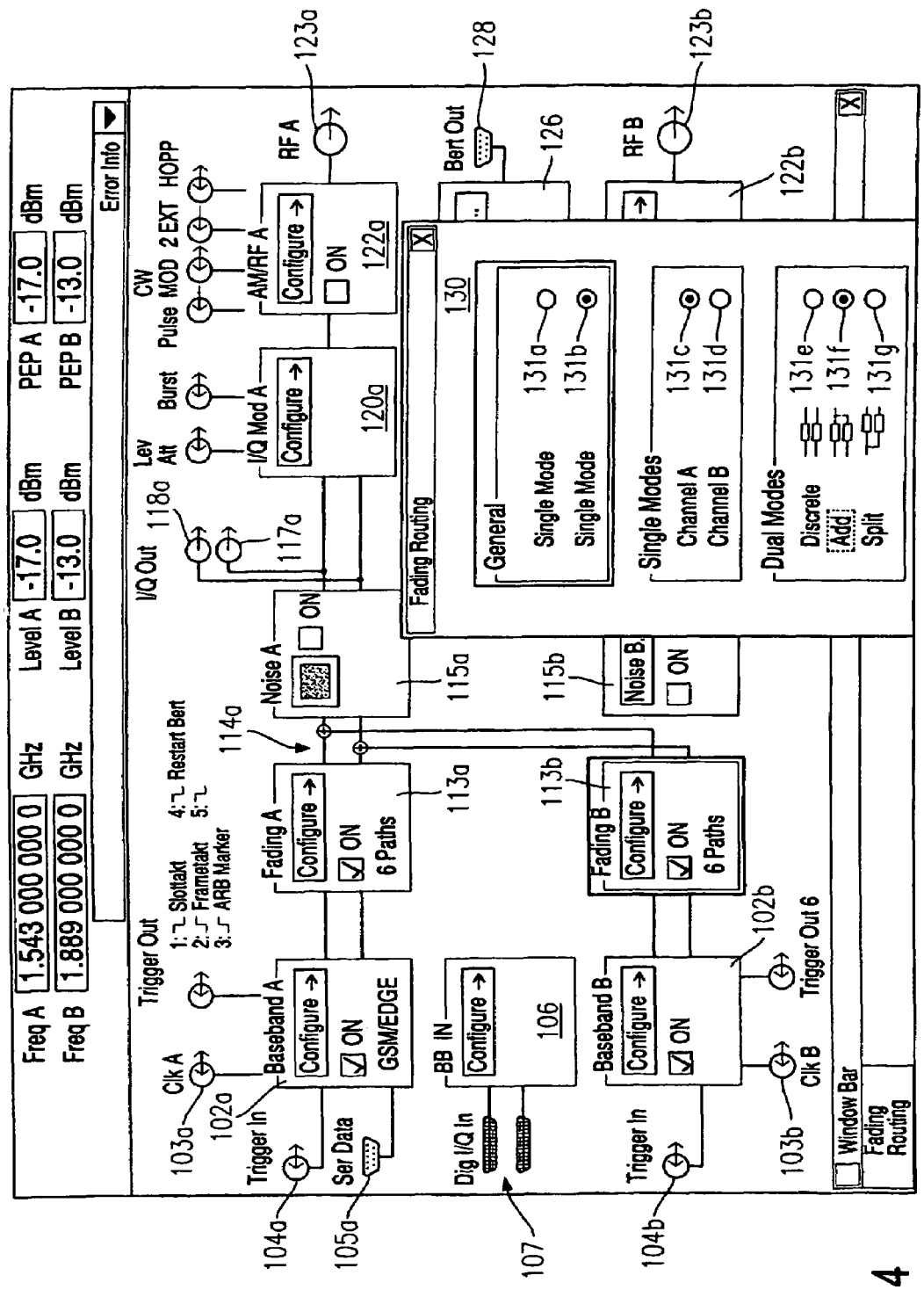
FIG. 4 shows a fourth example of the graphic display according to the invention of the functional blocks symbolizing the functional units.

FIG. 4 shows a further example of the graphic surface of the display device 29. The configuration presented is identical with that shown in FIG. 3. The selection of the function for the fading units 13a and 13b is shown as an example for the functional selection of the functional units. The user guides a cursor to the graphic position of one of the two fading blocks 113a or 113b. As already described, the functional blocks 113a and 113b symbolize the fading units 13a and 13b. The cursor is positioned either with a rotary knob 31 provided at the front of the signal generator 1 or via an externally connected, mobile positioning element 33 (mouse). When the cursor is inside the fading block 113a and 113b on the "configure→" button and when an appropriate key is pressed in this position, the graphic function-selection window "fading routing" 130, displayed at bottom right in FIG. 4, will open.

In this function-selection window 130, the user can again select one of the graphic selection elements 131a to 131g using the positioning element 33 (mouse or rotary knob 31). "Dual mode" is switched on, that is to say, both fading units 13a and 13b are activated, by means of an appropriate key stroke at the position of the selection element 131b. In "dual mode", the user can choose between the three variants "discrete", "add" and "split". With the operating mode "discrete", the fading units 13a and 13b are not connected to one another, but are supplied separately to the relevant noise unit 15a and/or 15b. In the operating mode "add", which is selected in FIG. 4, the outputs from the fading units 13a and 13b are combined in the addition unit 14a. Conversely, in the operating mode "split", one of the base band units 2a or 2b is divided between the two fading units 13a and 13b. The fading blocks 130a and 130b directly indicate how many signal paths are active in the relevant fading unit 13a and/or 13b (6 paths).

Figure 5:
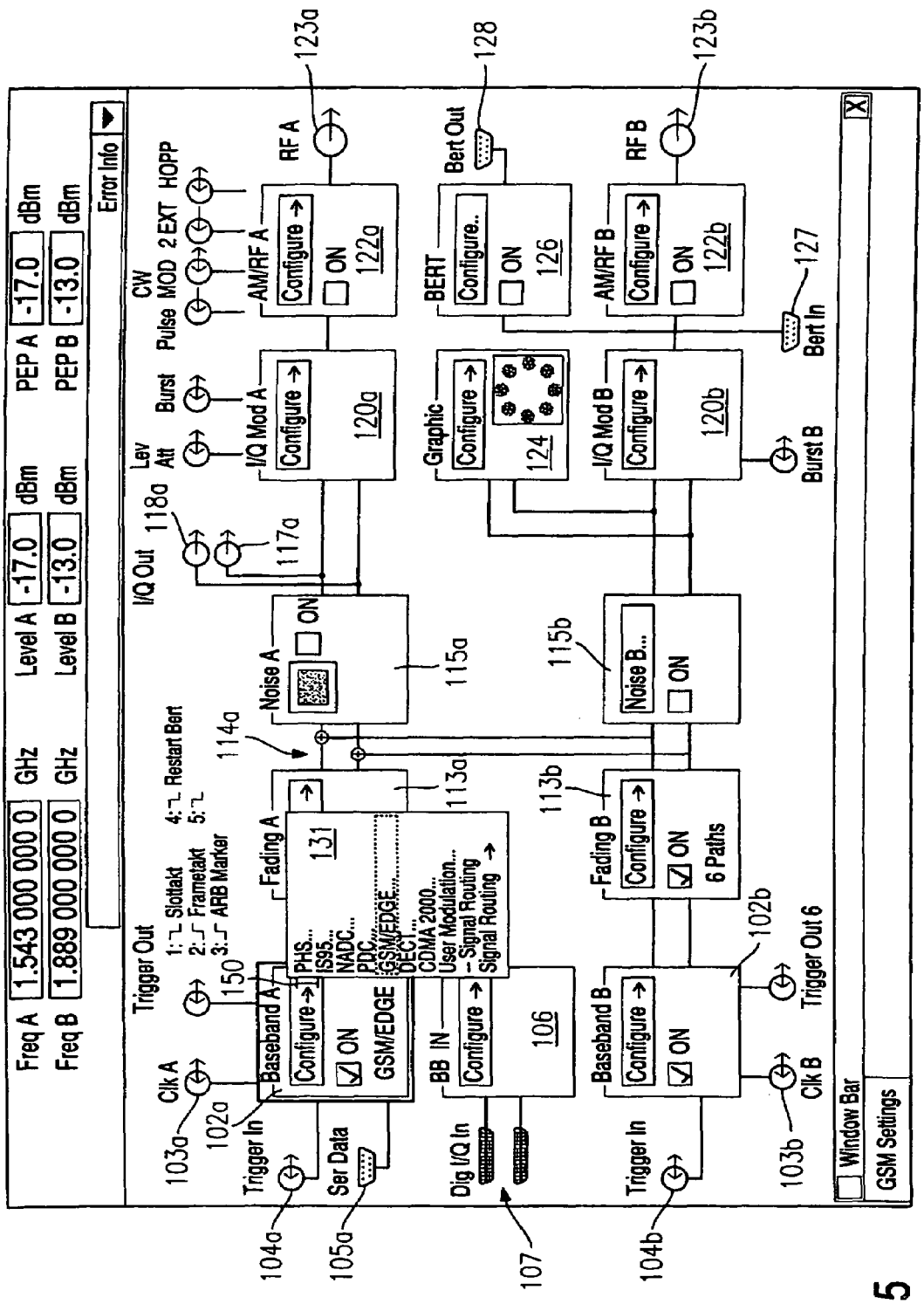
FIG. 5 shows a fifth example of the graphic display according to the invention of the functional blocks symbolizing the functional units.

FIG. 5 shows a further example of the graphic display of the functional blocks on the display device 29. The configuration of the functional blocks corresponds largely to that from FIGS. 3 and 4, the difference being that the input to the second noise unit 15b is additionally connected to the output from the second fading unit 13b. FIG. 5 illustrates the functional selection of the base band unit 2a. When the cursor is positioned over the base band block 102a, which, as a functional block symbolizes the functional unit corresponding to the base band unit 2a, the function-selection list (menu) 131 can be opened. For this purpose, the user activates a key, when the cursor is positioned on the "configure→" button. In the function-selection list 131, the user will find a list of all the base band signals which can be generated by the base band unit 2a. The list shows abbreviations for the relevant standards. For example, it is possible to choose between the standards "PHS", "IS95", "NADC", "PDC", "GSM/EDGE", "DECT", "CDMA 2000". Furthermore, under the menu item "user modulation", the user himself can supply modulation data to the base band unit 2a via the socket 5a, thereby determining the modulation in a user-defined manner. The selected standard "GSM/EDGE" appears in the functional block 102a, so that the user can recognize the selected operating mode for the base band unit 2a at a glance, even after the function-selection list 131 has been closed.

Figure 6:
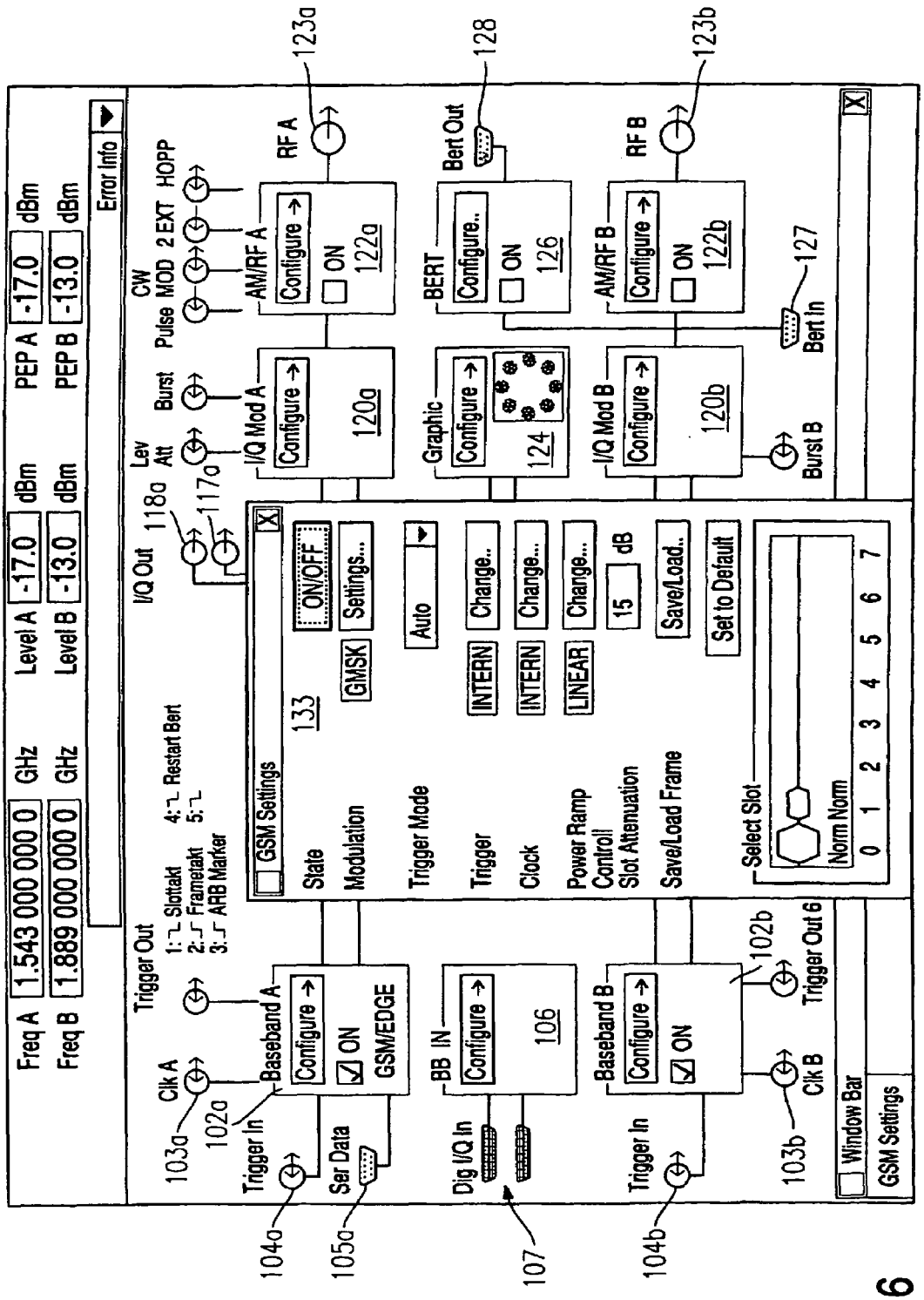
FIG. 6 shows a sixth example of the graphic display according to the invention of the functional blocks symbolizing the functional units.

If the user selects the standard "GSM/EDGE" in the function-selection list 131, the graphic function-selection window "GSM settings" 133, shown in FIG. 6, will open. In this function-selection window 133, the user can carry out various adjustments to the parameters of the GSM standard. Further function-selection windows may optionally be opened when the appropriate buttons are activated.

Figure 7:
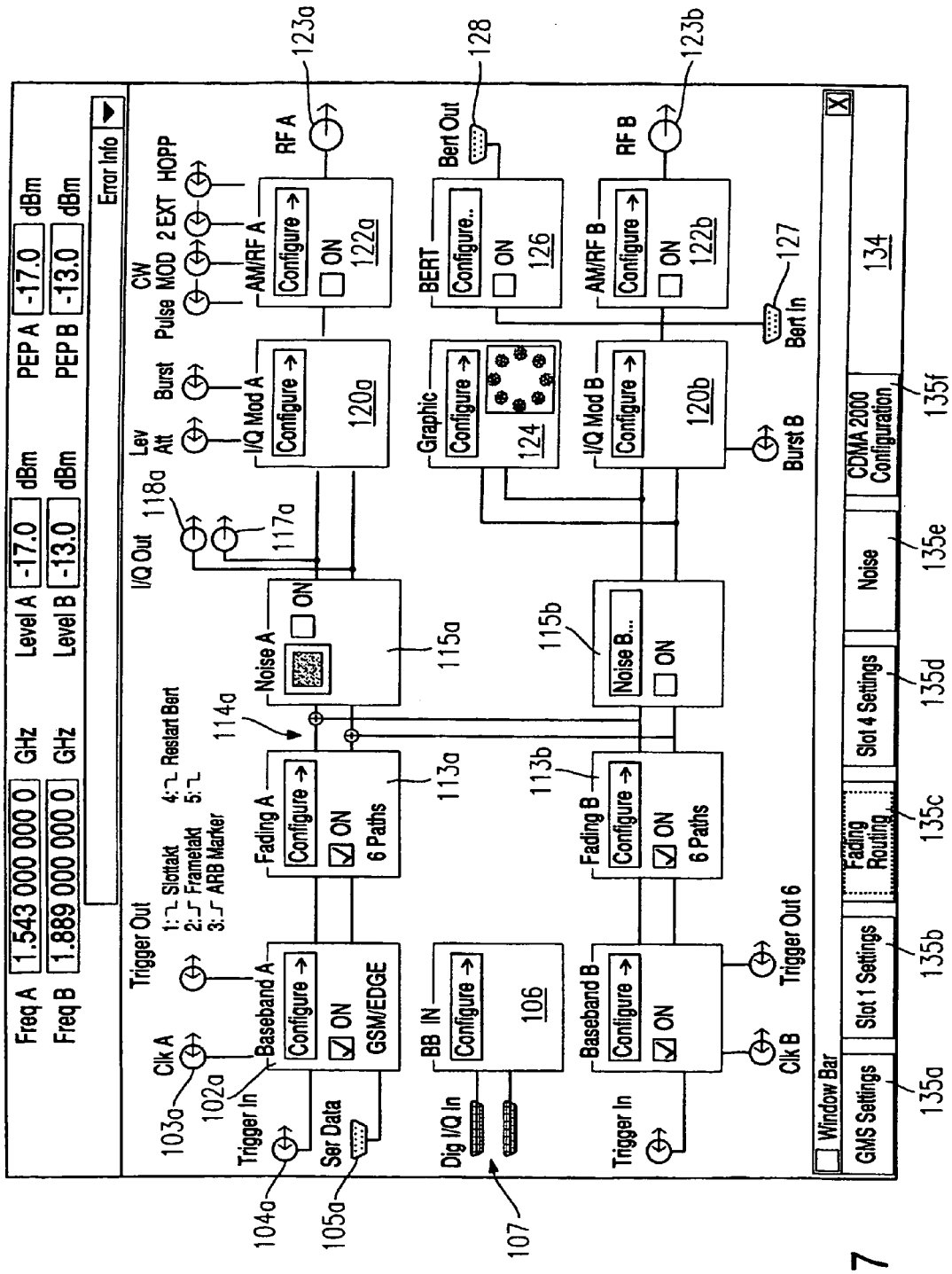
FIG. 7 shows a seventh example of the graphic display according to the invention of the functional blocks symbolizing the functional units.
Figure 8:
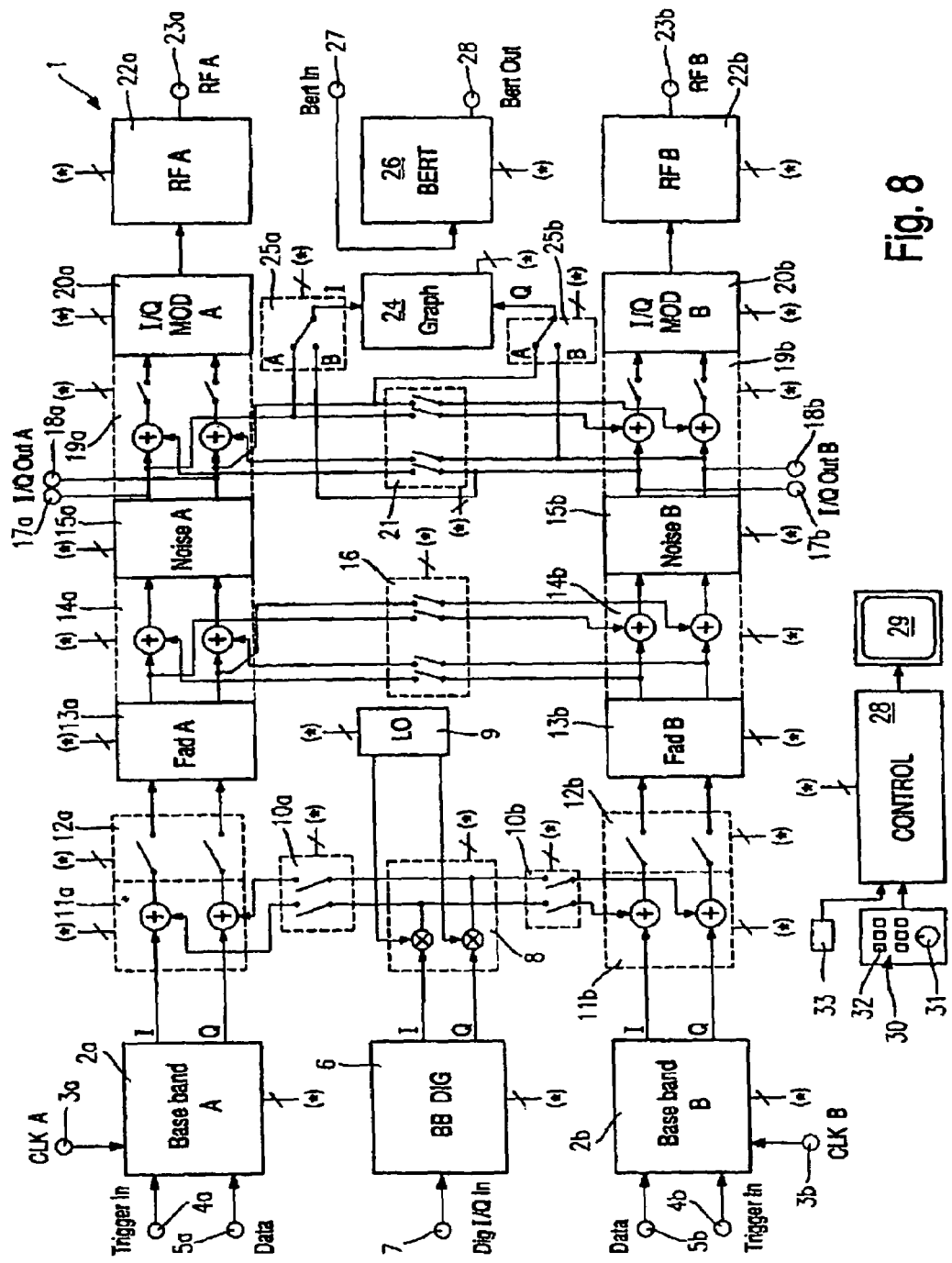
FIG. 8 shows a block circuit diagram of an exemplary embodiment of a signal generator designed as a measuring device according to the invention.

FIG. 7 shows another example of the graphic surface of the display device 29. The configuration of the functional blocks is identical to that shown in FIG. 5. However, several buttons 135a to 135f are additionally shown in a window defined as "window bar" 134. The corresponding function-selection windows are called up by activating these buttons 135a to 135f. For example, if the button 135c is activated, the function-selection window "fading routing" 130 will open, as shown in FIG. 4. If the button 135a is activated, the function-selection window "GSM settings" 133, which is shown in FIG. 6, will open. In this manner, user-friendly management of the active function-selection windows is ensured.

Operation of the device is considerably simplified in the above manner. The currently set functions of the functional units can be read off either directly from the allocated functional blocks or by activating the "configure→" button in the corresponding function-selection windows. By contrast with the previously conventional method of operation via soft keys or hard keys, operation is largely self explanatory, and it is not necessary to consult a user manual.

While the present invention has been described in connection with a number of embodiments and implementations, the present invention is not so limited but covers various obvious modifications and equivalent arrangements, which fall within the purview of the appended claims.

The invention claimed is:

1. A measuring device comprising:
   a plurality of functional units capable of being selectively connected to one another for performing a measurement on a signal;

a control device, internal to the measuring device, and coupled to the plurality of functional units, configured for setting a configuration and functions of the functional units; and a visual display device, internal to the measuring device and coupled to the control device, wherein a plurality of functional blocks symbolizing the functional units can be displayed on the display device and graphically connected by means of connecting elements, wherein the control device is further configured for controlling the display device so that the functional blocks are graphically interconnected by the connecting elements in a manner that corresponds to the current configuration of the functional units for performing the measurement on the signal and displaying a result.

2. A measuring device according to claim 1, wherein the functions of one of the functional units can be selected by moving a cursor displayed on the visual display device, by means of a positioning element, to a graphic position of a corresponding one of the functional blocks, and wherein, at the position of the corresponding one of the functional blocks, a function of the one of the functional units allocated to the corresponding one of the functional blocks is selected from a function-selection list or graphic function-selection window and communicated to the control unit to specify the function of the corresponding one of the functional units.

3. A measuring device according to claim 2, wherein one of the functional units includes a base band unit, and a type of signal generated by the base band unit can be selected by positioning the cursor on a functional block allocated to the base band unit.

4. A measuring device according to claim 3, wherein a digital base band generator unit is provided, of which the output signal can be added to the output signal from a base band unit.

5. A measuring device according to claim 3, wherein one of the functional units includes a fading unit connected in series to the base band unit, and a number, a time delay and an attenuation of signal paths provided in the fading unit can be selected by positioning the cursor on a functional block allocated to the fading unit.

6. A measuring device according to claim 5, wherein one of functional units includes a noise unit connected in series to the base band unit or the fading unit, and a type and level of noise of the noise signal generated by the noise unit can be selected by positioning the cursor on a functional block allocated to the noise unit.

7. A measuring device according to claim 3, wherein one of the functional units includes an I/Q-modulator connected in series to the base band unit, the fading unit or the noise unit, and with which a burst-sequence signal can be generated, and active bursts and a level of the bursts can be selected by positioning the cursor on a functional block allocated to the I/Q-modulator.

8. A measuring device according to claim 7, wherein a configuration diagram can be displayed in a display field on the display device at least one of an input of the I/Q-modulator and at an output of at least one of the base band unit or the fading unit.

9. A measuring device according to claim 7, wherein one of the functional units includes a high-frequency unit connected in series to the I/Q-modulator, and one or more output frequencies initiated according to a sudden frequency change procedure can be selected by positioning the cursor on a functional block allocated to the high-frequency unit.

10. A measuring device according to claim 9, wherein the base band unit, the fading unit, the noise unit, the I/Q-modulator and the high-frequency unit are present at least twofold, and that the inputs and/or outputs from the base band units, the fading units, the noise units, the I/Q-modulators and/or the high-frequency units can be connected to one another in a variable manner.

11. A method for controlling a measuring device having a plurality of functional units capable of being selectively connected to one another for performing a measurement on a signal, said method comprising:

setting a configuration and functions of the functional units in response to user input to a control device, internal to the measuring device and coupled to the plurality of functional units; and displaying, on a visual display device that is internal to the measuring device and coupled to the control device, a plurality of functional blocks respectively symbolizing the functional units and graphically connected by means of connecting elements such that the functional blocks are graphically interconnected by the connecting elements in a manner that corresponds to a current configuration of the functional units for performing the measurement on the signal and displaying a result.

12. A method according to claim 11, further comprising:

selecting the functions of one of the functional units based on input received from moving a cursor displayed on the visual display device, by means of a positioning elements to a graphic position of a corresponding one of the functional blocks;

selecting, at the position of the corresponding one of the functional blocks, a function of the one of the functional units allocated to the corresponding one of the functional blocks from a function-selection list or graphic function-selection window; and setting the function of the corresponding one of the functional units to the selected function.

13. A method according to claim 12, wherein one of the functional units includes a base band unit, and a type of signal generated by the base band unit can be selected by positioning the cursor on a functional block allocated to the base band unit.

14. A method according to claim 13, adding an output signal from a digital base band generator unit to the output signal from a base band unit.

15. A method according to claim 13, wherein one of the functional units includes a fading unit connected in series to the base band unit, and a number, a time delay and an attenuation of signal paths provided in the fading unit can be selected by positioning the cursor on a functional block allocated to the fading unit.

16. A method according to claim 15, wherein one of functional units includes a noise unit connected in series to the base band unit or the fading unit, and a type and level of noise of the noise signal generated by the noise unit can be selected by positioning the cursor on a functional block allocated to the noise unit.

17. A method according to claim 13, wherein one of the functional units includes an I/Q-modulator connected in series to the base band unit, the fading unit or the noise unit, and with which a burst-sequence signal can be generated, and active bursts and a level of the bursts can be selected by positioning the cursor on a functional block allocated to the I/Q-modulator.

18. A method according to claim 17, further comprising displaying a configuration diagram in a display field on the visual display device at least one of an input of the I/Q-modulator and at an output of at least one of the base band unit or the fading unit.

19. A method according to claim 17, wherein one of the functional units includes a high-frequency unit connected in series to the I/Q-modulator, and one or more output frequencies initiated according to a sudden frequency change procedure can be selected by positioning the cursor on a functional block allocated to the high-frequency unit.

20. A method according to claim 19, furthering comprising providing the base band unit, the fading unit, the noise unit, the I/Q-modulator and the high-frequency unit in at least twofold, such that the inputs and/or outputs from the base band units, the fading units, the noise units, the I/Q-modulators and/or the high-frequency units can be connected to one another in a variable manner.

* * * * *